(12) United States Patent
Srinivasan et al.

(10) Patent No.: US 8,747,684 B2
(45) Date of Patent: Jun. 10, 2014

(54) MULTI-FILM STACK ETCHING WITH POLYMER PASSIVATION OF AN OVERLYING ETCHED LAYER

(75) Inventors: Sunil Srinivasan, Milipitas, CA (US); Jinhan Choi, San Ramon, CA (US); Anisul H. Khan, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 768 days.

(21) Appl. No.: 12/860,672

(22) Filed: Aug. 20, 2010

(65) Prior Publication Data

US 2011/0045672 A1　Feb. 24, 2011

Related U.S. Application Data (60) Provisional application No. 61/235,651, filed on Aug. 20, 2009.

(51) Int. Cl.
*B44C 1/22* (2006.01)

(52) U.S. Cl.
USPC .............. 216/58; 438/720; 438/743; 438/945

(58) Field of Classification Search
None
See application file for complete search history.

(56) References Cited

U.S. PATENT DOCUMENTS

| | | | | |
|---|---|---|---|---|
| 5,962,346 | A * | 10/1999 | Shue et al. | 438/720 |
| 6,051,467 | A * | 4/2000 | Chan et al. | 438/264 |
| 6,214,423 | B1 * | 4/2001 | Lee et al. | 427/492 |
| 6,916,746 | B1 * | 7/2005 | Hudson et al. | 438/706 |
| 7,105,439 | B2 * | 9/2006 | Chang et al. | 438/664 |
| 2002/0025673 | A1 * | 2/2002 | Song et al. | 438/649 |
| 2004/0092118 | A1 * | 5/2004 | Johnson et al. | 438/696 |
| 2005/0287740 | A1 * | 12/2005 | Wu et al. | 438/257 |
| 2007/0161186 | A1 * | 7/2007 | Ho | 438/257 |
| 2008/0211024 | A1 * | 9/2008 | Kato et al. | 257/350 |

* cited by examiner

*Primary Examiner* — Binh X Tran
*Assistant Examiner* — David Cathey, Jr.
(74) *Attorney, Agent, or Firm* — Blakely, Sokoloff, Taylor & Zafman LLP (57) ABSTRACT

A method and apparatus for plasma etching a workpiece, such as a semiconductor wafer, including a thin film stack having a top film disposed over a bottom film with an intervening middle film there between. Etch selectivity between the top and bottom films may be as low as between 1:1 and 2:1 and a first carbon-lean gas chemistry is used to etch through the top film, a second carbon-lean gas chemistry is used to etch through the middle film, and the bottom film is etched through by alternating between depositing a polymer passivation on the top film using a carbon-rich gas chemistry and an etching of the bottom film with a third carbon-lean gas chemistry, which may be the same as the first carbon-lean gas chemistry.

18 Claims, 10 Drawing Sheets

MULTI-FILM STACK ETCHING WITH POLYMER PASSIVATION OF AN OVERLYING ETCHED LAYER

CROSS REFERENCE TO RELATED APPLICATIONS

This application is related to, and claims priority to, the provisional utility application entitled "MULTI-FILM STACK ETCHING WITH POLYMER PASSIVATION OF AN OVERLYING ETCHED LAYER," filed on Aug. 20, 2009, having an application number of 61/235,651 and herein incorporated by reference in its entirety for all purposes.

BACKGROUND

1) Field

Embodiments of the present invention pertain to the field of thin-film plasma etching and, in particular, to multi-film stack plasma etching with polymer passivation.

2) Description of Related Art

Recent efforts towards scaling the dimensions of semiconductor devices have include highly integrated film stack having a multiplicity of thin film layers. Such multi-film stacks find wide utility in wide array of microelectronic devices, such microprocessors, volatile and non-volatile memories, MEMS, and three-dimensionally integrated active device structures in which the vertical dimension is added to the lateral dimensions to increase the level of device integration via vertically adjacent active devices. For example, a first transistor or memory cell may be integrated with a second transistor or memory cell disposed above the first in a manner such that one or more patterned features (e.g., a gate stack, wordline, etc.) may be shared between them.

While such vertically integrated multi-film stacks may be advantageous for a number of reasons, such multi-film stacks generally can increase the complexity of etch processes used to pattern such stacks with a particular masking pattern.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

SUMMARY OF DESCRIPTION

Plasma etching of a multi-film stack with passivation is described. A method and apparatus for plasma etching a workpiece, such as a semiconductor wafer, including a thin film stack having a top (first) film disposed over a bottom (third) film with an intervening middle (second) film there between is described for particular embodiments of the present invention. A first carbon-lean gas chemistry is used to etch through the top film, a second carbon-lean gas chemistry is used to etch through the middle film, and the bottom film is etched through by alternating between depositing a polymer passivation on the top film using a carbon-rich gas chemistry and an etching of the bottom film with a third carbon-lean gas chemistry, which may be the same as the first carbon-lean gas chemistry. Where etch selectivity between the top and bottom films may be as low as between 1:1 and 2:1, the iterative deposition and etching is clears the bottom film with reduced erosion of the top and/or middle films.

In a particular embodiment, the first and third films each comprise tungsten, titanium, tantalum, aluminum, and the second film comprises polysilicon or amorphous silicon, such as may be found in a CMOS gate electrode stack, for example. The first and third carbon-lean gas chemistries may be carbon-free and include etchant gases such as C12 and SF6 or C12 and NF3, for example. The second carbon-lean gas chemistry may also be carbon-free and include etchant gases such as C12, HBr, and more or more of CHF3 and CF4. Either of both of the first and second carbon-lean gas chemistries may further include an additive such as N2 and/or O2 along with an inert such as He. The carbon-rich gas chemistry may include a carbon-rich polymerizing source gas including at least one of $CH_4$, $C_4F_8$, $C_4F_6$, and $CHF_3$ and may further include an inert such as Ar or He. RF bias power may be modulated between passivation and etching processes with the RF bias power being as low as 0 W during the passivation process.

DETAILED DESCRIPTION

Plasma etching of a multi-film stack with passivation is described. In the following description, numerous specific details are set forth, such as fabrication conditions and materials, in order to provide a thorough understanding of the present invention. It will be apparent to one skilled in the art that the present invention may be practiced without these specific details. In other instances, well-known features, such as lithographic mask patterning and thin film deposition, are not described in detail in order to not unnecessarily obscure the present invention. Furthermore, it is to be understood that the various embodiments shown in the Figures are merely illustrative representations.

The terms "over," "under," "between," and "on" as used herein refer to a relative position of one member with respect to other members. As such, for example, one member disposed over or under another member may be directly in contact with the other member or may have one or more intervening members. Moreover, one member disposed between members may be directly in contact with the two members or may have one or more intervening members. In contrast, a first member "on" a second member is in contact with that second member. Additionally, the relative position of one member with respect to other members is provided assuming operations are performed relative to a substrate without consideration of the absolute orientation of the substrate.

In one embodiment, formation of a vertically integrated device includes etching a multi-film stack in which a first material layer has at least similar etch characteristics to a third material layer disposed below the first layer and separated from the first layer by a second, intervening material layer. In another embodiment, formation of a vertically integrated device includes etching a multi-film stack in which a first material layer is repeated as a third film material and vertically spaced apart from the first film material by a second, intervening material layer of different composition. Repetition of same material layers within a stack may drastically increase (e.g., double) the effective thickness of material layers ordinarily made very thin, increasing etch aspect ratios (AR) and reducing process margins.

For the multi-film stacks described herein, the first and third material layers are either of the same material composition or at least have similar etch characteristics. When the first material layer (e.g., a top thin film) is patterned into features and subsequently exposed to a second reactive etching process during the etch of the same or similar second material layer (e.g., a bottom thin film), there is the potential to quickly erode those features previously formed in the first material layer. For example, where a top film and an intervening film is first etched to have a feature CD of about 20 nanometers (nm), the subsequent etch of a bottom film having the same material composition as the top film may completely erode the 20 nm features previously formed absent the passivation process described herein. As such, the multi-film stack etches described herein are readily distinguishable both from stack etches where an underlying thin film may be etched with conditions which are selective over an overlying thin film and from etches of a contiguous film lacking the additional complexity of an intervening layer.

Figure 1A:
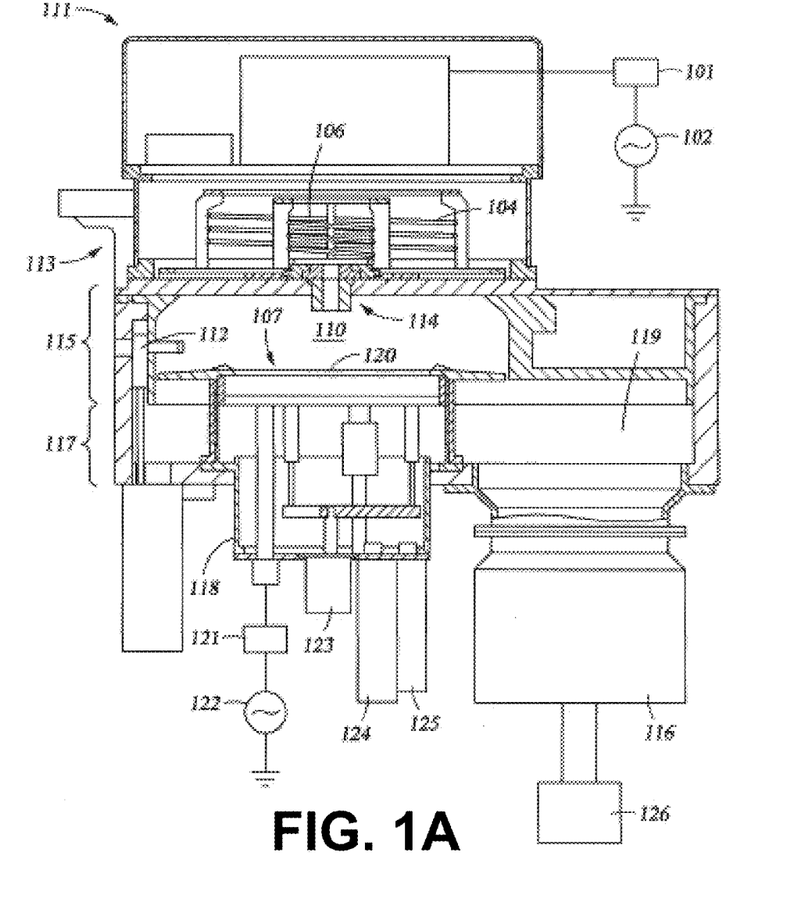
FIG. 1A illustrates an example of a plasma etch system which may be employed to process a workpiece in accordance with an embodiment of the present invention.

FIG. 1A illustrates an example of a plasma etch system 100 which may be employed to process a workpiece in accordance with an embodiment of the present invention. The various exemplary embodiment examples of the multi-film stack etch methods described herein may be performed in a DPS II Processing Chamber available from Applied Materials, Inc., Santa Clara, Calif. The DPS II Processing Chamber may be used as part of an Integrated Processing System, also available from Applied Materials, where transfer between combinations of different processing chambers (which make up an Integrated Processing System) enables a variety of processing procedures without exposing the substrate to the ambient environment. An advantageous Integrated Processing System is the Centura® Mainframe System, which is also available from Applied Materials, Inc.

The plasma etch system 100 is a fully automated semiconductor etch processing chamber of the kind which is typically employed as part of a multi-chamber, modular system (not shown) which may accommodate a variety of substrate sizes. The plasma etch system 100 includes a DPS II Upper Processing Chamber 115 having a processing volume 110 designed to accommodate a substrate diameter size up to 12 inch (300 mm).

The plasma etch system 100 is configured to be mounted on a standard CENTURA® mainframe (not shown). The plasma etch system 100 includes a plasma source power 102 and matching network 101 which are in communication with power generating apparatus present within enclosure 111. The RF inductively coupled plasma source power 102 and matching network 101 operate at a frequency which is typically in the range of about 12 MHz to about 13.5 MHz (while this particular processing apparatus operates at this frequency, other processing apparatus which may be used operate at source power frequencies ranging up to 60 MHz), at a power in the range from 0.1 kW to about 5 kW. The upper processing chamber 115 makes use of an RF inductively coupled plasma (not shown) which is generated using inductive coils 104 and 106 which are located within an enclosure 113, just above upper processing chamber 115. Upper processing chamber 115 includes a processing chamber volume 110 of the size described above, and an electrostatic chuck (ESC) cathode 107. Plasma source gas is introduced into the upper processing chamber 115 through a fast gas exchange nozzle 114, to provide uniformed controlled gas flow distribution. Chamber pressure is controlled by a capacitance manometer control system (not shown). The processing chamber volume 110 present within upper processing chamber 115 is in communication with a lower processing chamber 117 which is in communication with a throttle valve 119 located above and in communication with a turbo pump 116, which is located above and in communication with a rough pump 126. When the Processing Apparatus 100 is in operation, new plasma source gas is continually charging to process chamber volume 110 and processing by-products are constantly exiting through the throttle valve 119, turbo pump 116 and rough pump 126.

During processing, a workpiece (not shown) is introduced into the processing chamber volume 110 through inlet 112. The processing chamber volume 110 includes an electrostatic chuck (ESC) cathode 107 and an inlet from fast gas exchange nozzle 114. A workpiece is placed on the cathode 107 during a particular process. Chamber pressure is controlled by a pressure control system (not shown) which activates various devices typically including the fast gas exchange nozzle 114, throttle valve 119, turbo pump 116 and rough pump 126. The workpiece is held in place by a mechanism which employs a static charge generated on the surface of electrostatic chuck (ESC) cathode 107 by applying a DC voltage (not shown) to a conductive layer located under a dielectric film on the chuck surface 120. The electrostatic chuck/cathode 107 is typically cooled using a heat transfer device (not shown) cooled using a compression chiller (not shown) fed with fluid from inlet 124, which subsequently exits from outlet 125. The electrostatic chuck/cathode 107 and workpiece (not shown) are raised and lowered by means of a lift 123 for processing. Etch gases are introduced into an upper processing chamber 110 fast gas exchange manifold (not shown).

A controller (not shown) may be provided to control the operations of the plasma etch system 100, to carry out embodiments of the present invention. The workpiece is biased with an RF power 122 and matching network 121 operating within the range of 100 kHz to 13.56 MHZ; more typically, within the range of 100 kHz to 2 MHZ. Plasma source power 102 and workpiece biasing power 122 are independently controlled Applied Materials, Inc. system software (not shown) which is provided at the controller. In particular, the RF biasing power 122 is pulsed using generator pulsing capability set by system controls (not shown) to provide a percentage of time that the power is on which is referred to as the pulse "duty cycle". Typically the time on and time off of a pulsed bias power is uniform throughout substrate processing. In this instance, for example, if the power is on for 3 msec and off for 15 msec, the pulse "duty cycle" would be 16.67%. The pulsing frequency in cycles per second (Hz) is equal to 1.0 divided by sum of the on and off time periods in seconds. For example, when the power is on for 3 msec and off for 15 msec, for a total of 18 msec, the pulsing frequency in cycles per second is 55.55 Hz. It would also be possible to use a specialized pulsing profile where the on/off timing changes during substrate processing for particular needs.

The temperature on the surface of the etch chamber walls is controlled using liquid-containing conduits (not shown) which are located in the walls of the upper etch chamber 115. The temperature of the semiconductor substrate is controlled using the temperature of the electrostatic chuck cathode 107 surface 120 upon which the substrate (not shown) rests. Typically, a helium gas flow is used to facilitate heat transfer between the substrate (not shown) and the cathode 107 surface 120. The heat transfer fluid used at the surface of the electrostatic chuck cathode is provided through a fluid conduit system (not shown).

As previously mentioned, although the plasma etch system 100 used to process the workpieces described in the description provided herein was an inductively coupled etch chamber of the kind shown in schematic in FIG. 1A, any of the etch processors available in the industry which can essentially duplicate the process described herein should be able to take advantage of the teachings described herein, with some adjustment to the processing apparatus parameters. It is contemplated that other plasma etch processing apparatus known in the industry may be used to carry out various embodiments of the invention.

Figure 1B:
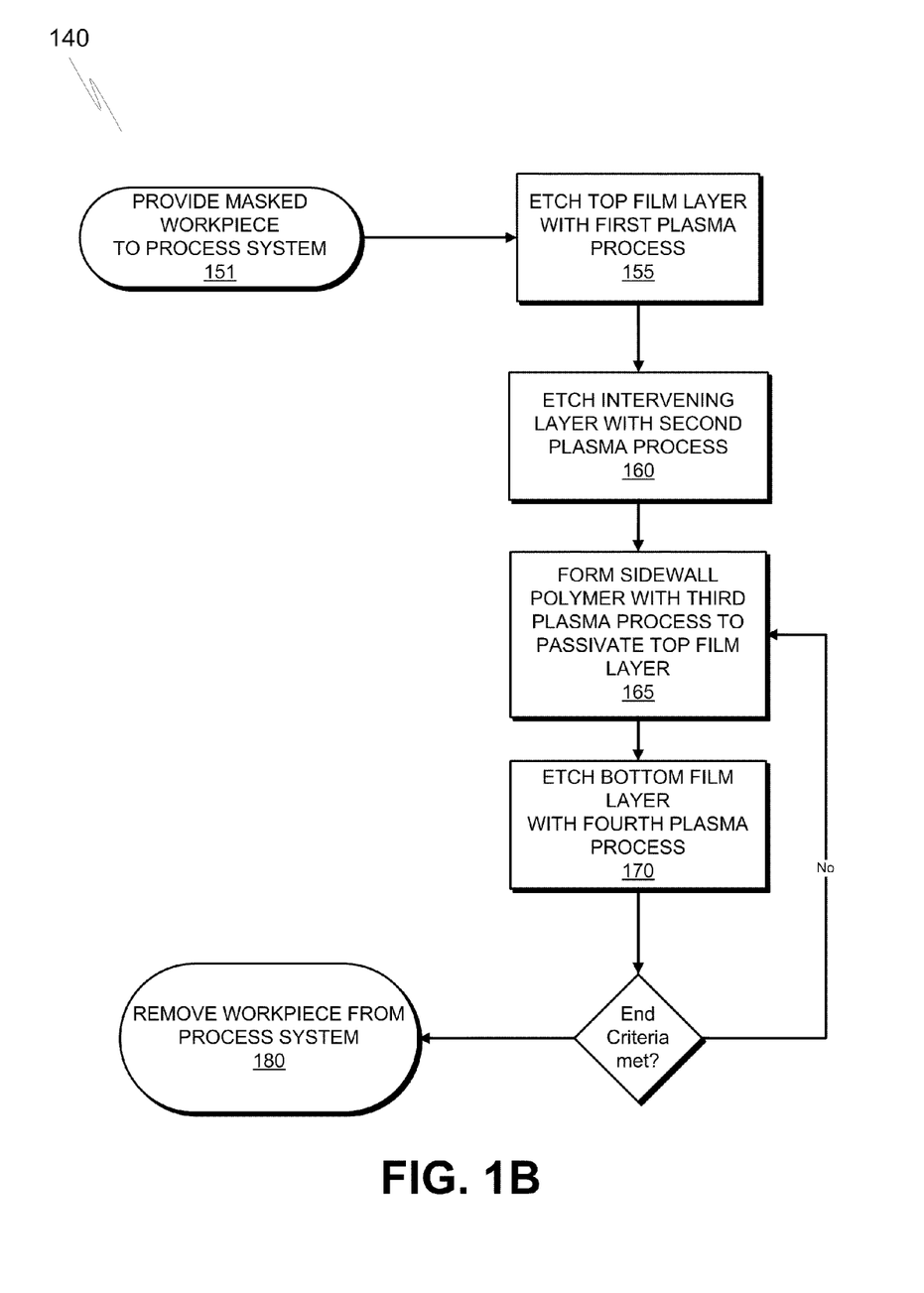
FIG. 1B illustrates a flow diagram of a method to etch a multi-film stack with polymer passivation with the plasma etch system depicted in FIG. 1A, in accordance with an embodiment.

FIG. 1B illustrates a flow diagram of an exemplary method 140 to etch, with polymer passivation, a multi-film stack including a plurality of material layers having similar etch characteristics separated vertically within the stack by an intervening layer having dissimilar etch characteristics. The method 140 entails providing a masked workpiece to a plasma process system, such as that depicted in FIG. 1A, at operation 151. Then, at operation 155, a top film layer of the multi-layered film stack is etched with a first plasma process. Subsequent to etching through the top film layer, at operation 160, an intervening layer is etched with a second plasma process. The intervening layer, disposed below the top film layer in the multi-layered stack has different etch characteristics from those of the top film layer and a bottom film layer disposed below the intervening layer. Following the second plasma etch process operation 160, a polymer passivation operation 165 is performed to protect the top film layer features from attack during a fourth plasma process used to etch the bottom film layer at operation 170. The polymer passivation formed at operation 165 reduces the top film's reaction rate with the etchants present during the fourth plasma process. As shown in FIG. 1B, the plasma polymer passivation operation 165 and plasma etch operation 170 may be repeated until an etch end criteria, such as an etch duration, or endpoint signal threshold, is achieved. The exemplary method 140 is then completed at operation 180 with removal of the workpiece from the plasma processing system.

Figure 1C:
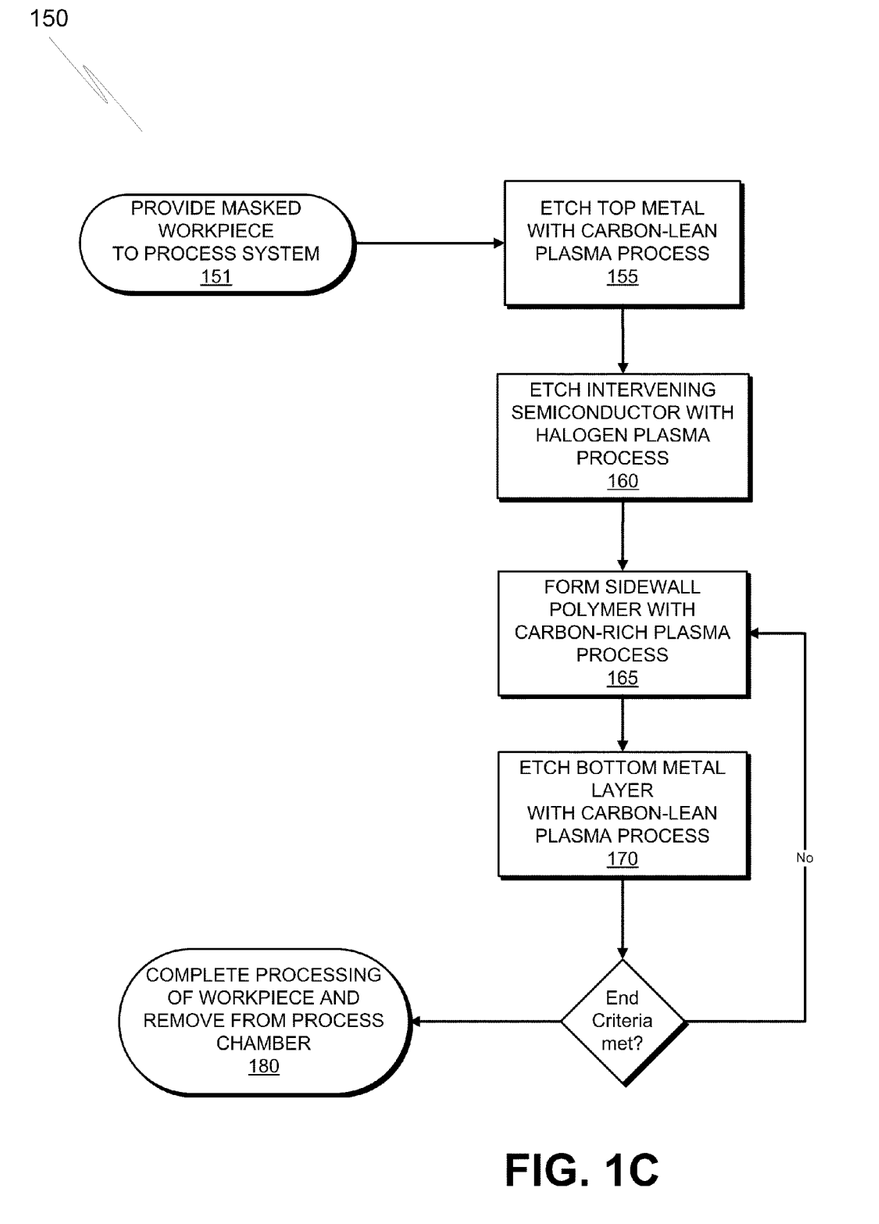
FIG. 1C illustrates a flow diagram of a method to etch a multi-film stack with polymer passivation using a plasma etch system such as that depicted in FIG. 1A, in accordance with an embodiment.

FIG. 1C illustrates a process flow diagram of an exemplary method 150 for etching, with polymer passivation, a multi-film stack including similar material layers spaced apart by a dissimilar material layer. FIG. 1C is to be considered a specific implementation of the process flow diagram depicted in FIG. 1B. FIGS. 2A-2F illustrate schematic cross-sectional views of a multi-film stack 200 as particular operations of the exemplary methods 140 or 150 are performed.

The method 150 begins with provision of a workpiece to a plasma processing system, such as the system depicted in FIG. 1A. The workpiece may be a semiconductor device, such as a processor or memory device, a LCD device, or a photovoltaic, for example. As further depicted in FIG. 2A, the workpiece includes a multi-film stack 200 formed over a stop layer 201 and under a mask layer 240. The stop layer 201 is a layer upon which etching of the multi-film stack 200 is terminated. In the exemplary embodiment, the stop layer 201 is silicon dioxide, however the stop layer 201 may generally be of any insulator, semiconductor, or conductor material known in art, such as, but not limited to, silicon, silicon nitride, or silicon oxy-nitride. Disposed below the stop layer 201 is a substrate (not depicted) which may be composed of any material suitable for semiconductor device fabrication, such as, but not limited to, a bulk single crystalline silicon, germanium, silicon-germanium or a III-V compound semiconductor material, a top epitaxial layer of any of silicon, germanium, silicon-germanium or a III-V compound semiconductor on a middle insulator layer which is above a lower bulk layer (e.g., an SOI substrate).

Figure 2A:
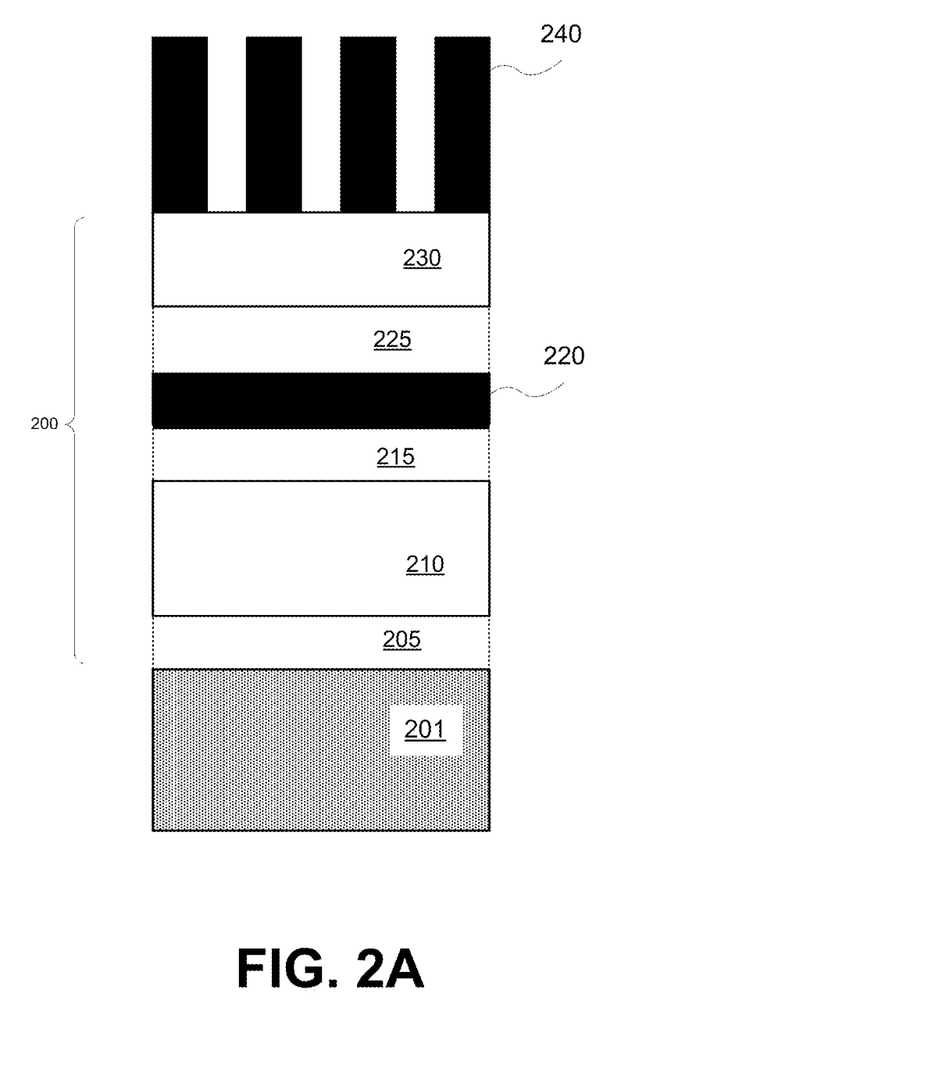
FIGS. 2A, 2B, 2C, 2D, 2E, 2F depict a schematic cross-sectional view of a microelectronic device at various stages of formation, in accordance with an embodiment.

The mask layer 240 may further include any organic or inorganic photosensitive or photoinsensitive (e.g., hardmask) masking material known in the art. In the exemplary embodiment, the mask layer 240 is silicon dioxide, however in alternative embodiments, the mask layer 240 is one of silicon nitride, silicon oxy-nitride, photoresist, a carbon-based CVD layer (e.g., diamond like carbon (DLC) or Advanced Patterning Film® (APF) by Applied Materials), or a composite stack thereof. As depicted in FIG. 2A, the mask layer 240 is patterned with features on the order of 45 nm or less and in particular embodiments, less than approximately 20 nm.

As further illustrated in FIG. 2A, the multi-film stack 200 includes at least three primary thin film layers 210, 220 and 230 spaced apart vertically within the stack such that the thin film layer 220 is an intervening material layer between the thin film layer 210 and 230. In addition to the three primary thin film layers 210, 220 and 230, the multi-film stack 200 may further include secondary thin film layers 205, 215 and 225 interspersed between the primary thin film layers 210, 220 and 230, as depicted. Depending on the embodiment, the secondary thin film layers 205, 215 and 225 may all be of a same material or stack of materials or each may be a different material or stack of materials than the others. In FIG. 2A, the secondary thin film layers 205, 215 and 225 are represented by dashed lines in recognition that such materials or stacks of materials are not present in certain embodiments of the multi-film stack 200 while the primary thin film layers 210, 220 and 230 are present in all embodiments of the multi-film stack 200. If present, the secondary thin film layers 205, 215 and 225 may be of any material conventional to the semiconductor arts, such as, but not limited to, silicon dioxide, silicon nitride, silicon oxy-nitride, metals and semiconductors.

In an embodiment, a top primary thin film layer 230 and a bottom primary thin film layer 210 share similar etch characteristics. For such embodiments, the top and bottom layers 230 and 210 need not be the same material, or same stack of materials but etch selectivity between the top and bottom layers 230 and 210 is nonetheless below 2:1 in some embodiments and approximately 1:1 in other embodiments. In still other embodiments, the top thin film layer 230 and the bottom thin film layer 210 are of a same material composition or of a same stack of materials. The intervening thin film layer 220 however, has etch characteristics different than both the top thin film layer 230 and bottom thin film layer 210 such that the etch of intervening thin film layer 220 has greater than at least 5:1 selectivity to the top and bottom layer 210 and 230.

In particular embodiments, at least one of the intervening thin film layer 220 and the top/bottom thin film layer 230/210 is a semiconductor while the other of the layers is a conductor. For example, in one such embodiment both the top thin film layer 230 and bottom thin film layer 210 are semiconductors while the intervening thin film layer 220 is a metal. In the exemplary embodiment depicted in FIG. 1C however, both the top thin film layer 230 and bottom thin film layer 210 are metals while the intervening thin film layer 220 is a semiconductor. For such an embodiment, any plasma-etchable metal known in the art may be so employed in the multi-film stack 200, such as, but not limited to, tungsten, titanium, tantalum, aluminum, their silicides and their nitrides. Similarly, any plasma-etchable semiconductor known in the art may be so employed in the multi-film stack 200, such as but not limited to, amorphous silicon, polycrystalline silicon, polycrystalline germanium, their alloys, III-V and II-VI compound semiconductors.

In alternative embodiments, at least one of the intervening thin film layer 220 and the top/bottom thin film layer 230/210 is a silicon oxide while the other of the layers is a nitride of silicon. In still other embodiments, at least one of the intervening thin film layer 220 and the top/bottom thin film layer 230/210 is a carbon-based layer, such as APF, while the other of the layers is non-carbon-based layer, such as silicon oxide or a nitride of silicon.

Returning to FIG. 1C, at the plasma etch operation 155 the metallic top thin film layer 230 is etched with a carbon-lean plasma process. Such an etch process may include any etchants and etch condition known in the art to be applicable for the particular composition of the metallic top thin film layer 230. In particular embodiments where the metal may be etched with a fluorine-based chemistry the carbon-lean fluorinated gas chemistry is employed. For example, in one embodiment where the multi-film stack 200 includes a tungsten, titanium, tantalum, or aluminum top thin film layer 230, $NF_3$ is employed alone or in combination with one or more etchant gases, such as $Cl_2$, along with additives such as $O_2$ and $N_2$, as well as inerts, such as He or Ar for a substantially carbon-free plasma etch operation 155. In other embodiments, carbon-lean fluorocarbon gases, such as $CF_4$ may also be employed. In an embodiment where the metallic top thin film layer 230 includes aluminum or titanium (or silicides/nitrides thereof), $Cl_2$ is employed alone or in combination with one or more etchant gases, such as $SF_6$, along with additives such as $O_2$ and $N_2$, as well as inerts, such as He or Ar for a substantially carbon-free plasma etch operation 155. Process pressures and plasma powers may be selected based on the metallic top thin film layer 230, the chemistry, desired DC bias and size of the workpiece being processed. As an example, an $NF_3$:$Cl_2$ process may be performed at between 5 and 60 mT with each gas introduced a rate of between 10 and 200 sccm and source power between 200 and 1500 W while bias power is between 50 and 500 W.

Upon completing the etch of the metallic top thin film layer 230, the method 150 proceeds to operation 160 where a semiconducting intervening thin film layer 220 is then plasma etched with a halogen-based chemistry. Such an etch process may include any etchants and etch condition known in the art to be applicable for the particular composition of the semiconducting intervening thin film layer 220. For example, in one embodiment where the multi-film stack 200 includes a polysilicon or amorphous silicon semiconducting intervening thin film layer 220, one or more etchant gases, such as $Cl_2$ and HBr, along with additives such as $O_2$ and $N_2$, as well as inerts, such as He or Ar, are employed. Specific process pressures and plasma powers may be determined based on the layer composition, chemistry, desired DC bias and size of the workpiece being processed.

Figure 2B:
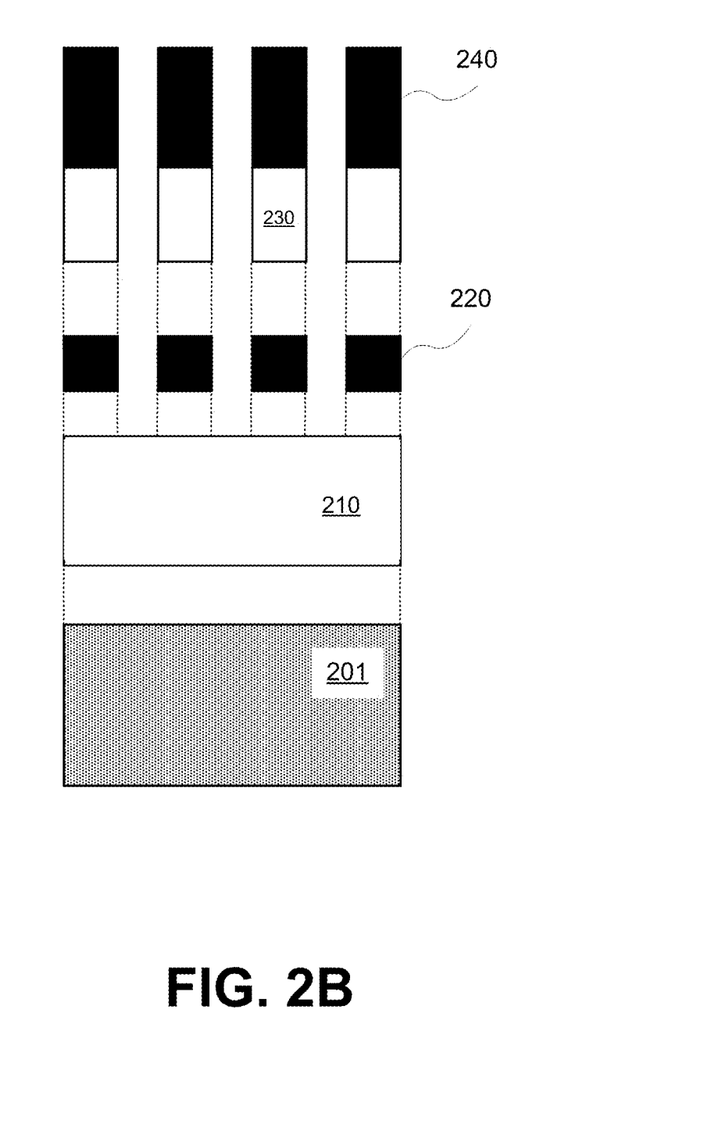

FIG. 2B depicts the multi-film stack 200 upon exposure of the bottom thin film layer 210. As shown, both the intervening thin film layer 220 and the top thin film layer 230 now have etched features. Any secondary thin film layers that are present at either interface of the intervening this film layer 220 are also to have been etched as depicted in FIG. 2B, either as part of an over etch of the primary thin film layers 220 and 230 or as a separate etch operation providing etch conditions specific to the secondary thin film material compositions.

Figure 2C:
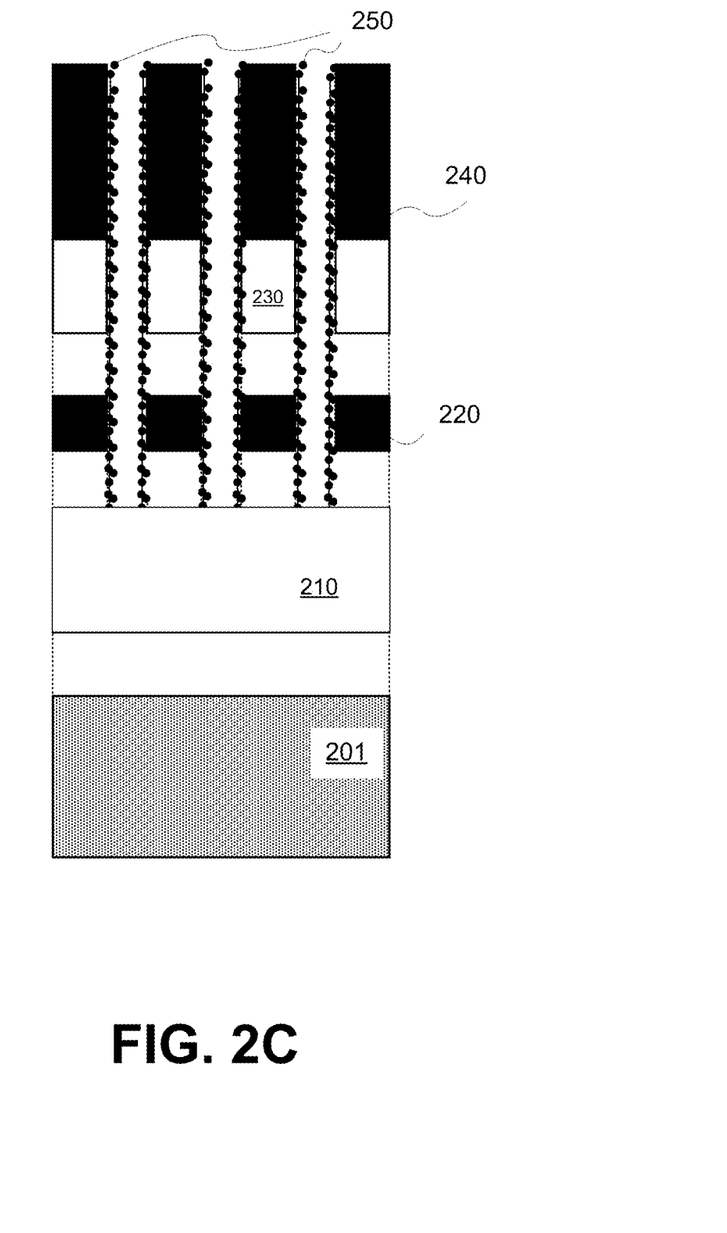

Upon exposing the bottom thin film layer 210, the method 150 proceeds to the polymer passivation operation 165 to form a polymer passivation 250 along the previously etched sidewalls of at least the top thin film layer 230, as depicted in FIG. 2C. As further shown, the polymer passivation 250 may also extend along the sidewalls of the intervening thin film layer 220, the mask layer 240 and secondary thin film layers interspersed there between.

Formation of polymer passivation 250 is dependent on a number of factors including, the material compositions of the thin film layers present in the multi-film stack 200, gas chemistry, plasma density, processing pressure, workpiece temperature, and DC bias, to name a few. For the exemplary method 150 employing a metallic top thin film layer 230, it has been found that medium to high density plasmas are advantageous for encapsulating the sidewalls of the patterned top thin film layer 230 with carbon-rich chemistries. In one such embodiment, an inductively coupled plasma source, such as that depicted in FIG. 1A, is employed with a source power between 200 W and 1500 W for a platform configured for a 300 mm substrate. In a further embodiment, little to no bias power (e.g., nominally 0 W) is applied during the polymer passivation operation 165. For such conditions, the nominal etch rate of the top and bottom thin film layers 230 and 210 is substantially zero and the polymer passivation 250 accumulates predominantly on the sidewalls.

In embodiments, carbon-rich polymerizing source gases are employed at the polymer passivation operation 165 including, but are not limited to, $CH_4$ and other light hydrocarbons, $C_4F_8$, $C_4F_6$, $CHF_3$, and combinations thereof. Inerts, such as He or Ar, may also be added to the carbon-rich polymerizing source gas. For example, in a particular embodiment where the metallic top thin film layer 230 and metallic bottom thin film layer 210 are composed of the same metal, such as tungsten, titanium, tantalum, or aluminum, Ar is provided at a 1:8 to 1:1 ratio with no bias power and source power in the range provided above. With a process pressure between 5 and 60 mT, operation 165 will form the polymer passivation 250 over the top thin film layer 230 in between 5 and 60 sec of processing time.

Returning to FIG. 1C, with feature sidewalls of the top thin film layer 230 encapsulated with a polymer passivation layer, the method 150 proceeds with etching the metallic bottom layer 210 at operation 170. In an advantageous embodiment, a carbon-lean plasma process is employed at operation 170. In one such embodiment, the carbon-lean plasma process is substantially the same as that employed at operation 155 to etch the metallic top layer 230. For one exemplary embodiment, where the metallic bottom thin film layer 210 and metallic top thin film layer 230 are composed of the same metal, such as tungsten, titanium, tantalum, or aluminum, $NF_3$ is employed alone or in combination with one or more etchant gases, such as $Cl_2$, along with additives such as $O_2$ and $N_2$, as well as inerts, such as He or Ar for a substantially carbon-free plasma etch operation 170. In other embodiments, carbon-lean fluorocarbon gases, such as $CF_4$ may also be employed.

In an alternative embodiment where the metallic bottom thin film layer 210 includes aluminum or titanium (or silicides/nitrides thereof), $Cl_2$ is employed alone or in combination with one or more etchant gases, such as $SF_6$, along with additives such as $O_2$ and $N_2$, as well as inerts, such as He or Ar for a substantially carbon-free plasma etch operation 170. In still other embodiments, the carbon-lean plasma process employed at operation 170 is distinct from that employed at operation 155 to etch the metallic top layer 230. For example, additives such as O₂ may be removed, source or bias power may be increased and pressure may be reduced, relative operation 155.

Figure 2D:
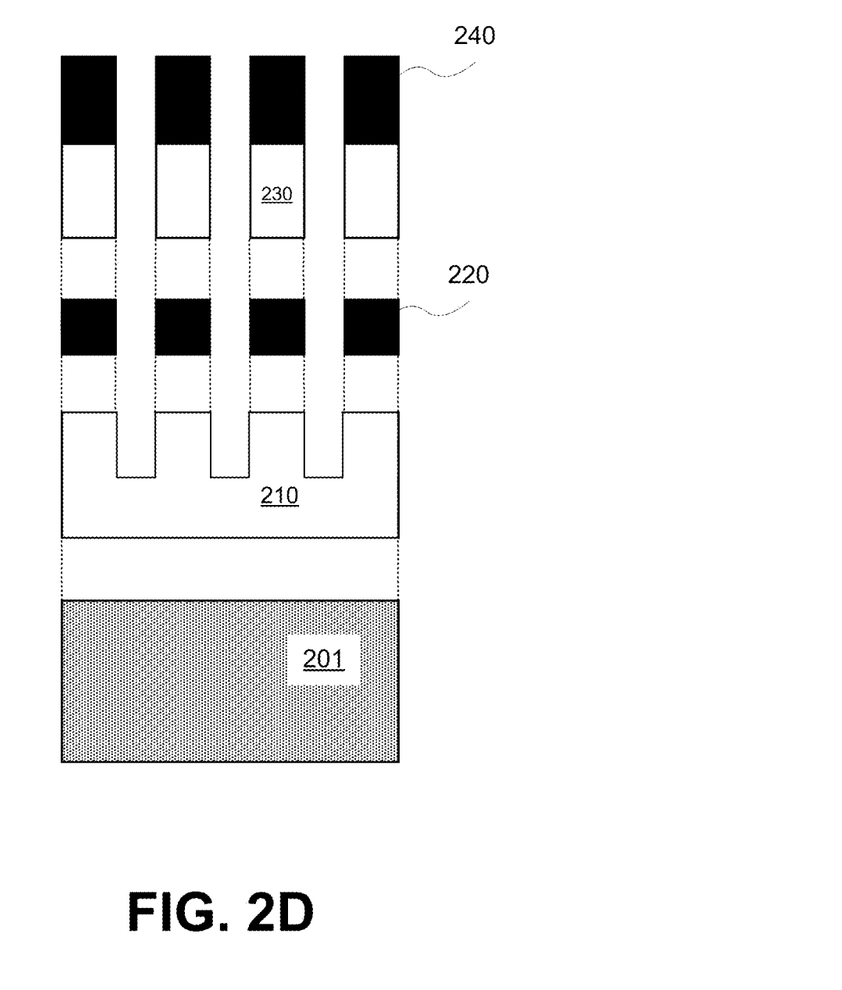
Figure 2E:
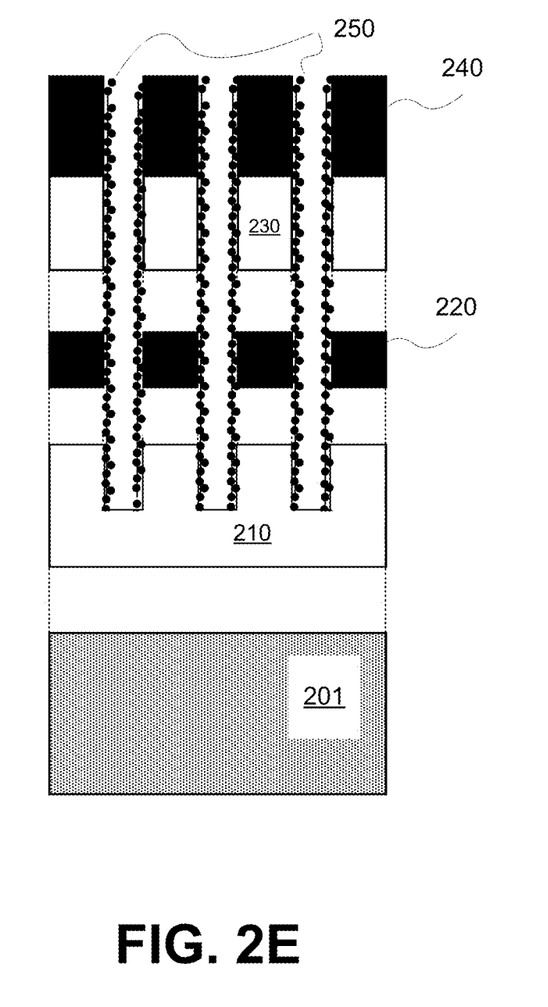
Figure 2F:
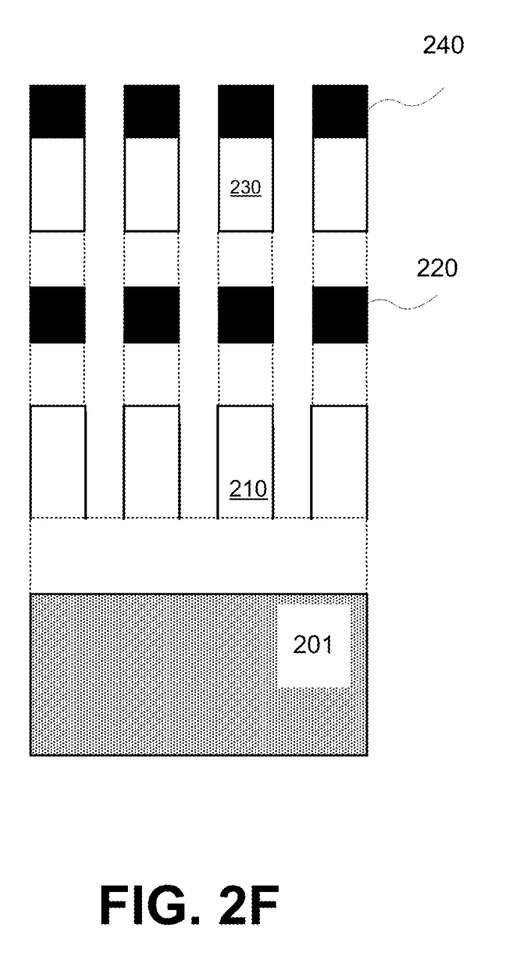

Depending on the thickness of the bottom thin film layer 210, susceptibility of the top thin film layer 230 to the etching condition employed for the bottom thin film layer 210, the duration of the etch operation 170 may be limited to ensure the polymer passivation 250 is not lost from either or both the top thin film layer 230 or intervening thin film layer 220. For example, where the bottom thin film layer 210 and top thin film layer 230 are both a same metal, such as tungsten, titanium, tantalum, and aluminum, and the intervening thin film 220 is polysilicon or amorphous silicon, the etch process conditions described above may be performed for approximately twice the duration of the polymer passivation operation 165 before the polymer passivation 250 is lost, as depicted in FIG. 2D. If prior to this time, an etch end time or endpoint threshold criteria is not met, method 150 returns to the polymer passivation operation 165 to repeat a carbon-rich plasma process substantially as previously described. FIG. 2E depicts the exemplary multi-film stack 200 following repetition of the polymer passivation operation 165. The etch operation 170 may then be repeated and the method 150 successively repeats operations 165 and 170 until the etch end criteria is met and the exemplary multi-film stack 200 is etched through to the stop layer 201, as depicted in FIG. 2F. Method 150 is then completed with removal of the workpiece from the processing system at operation 180.

It has been found that such polymer passivation of an overlying thin film layer sharing similar etch characteristics with an underlying thin film layer advantageously provides good CD control of the overlying thin film and as such it should be apparent to one familiar with the art that etch processes similar to those exemplary processes provided herein may be applied to a variety of multi-film stacks where same or similar film materials are vertically separated by an intervening dissimilar material. For example, multi-film stacks in volatile and non-volatile memories, MEMS, and three-dimensionally integrated active device structures, such as three dimension memory cells may be etched with little CD undercut of the overlying thin film using the methods described herein.

Figure 3:
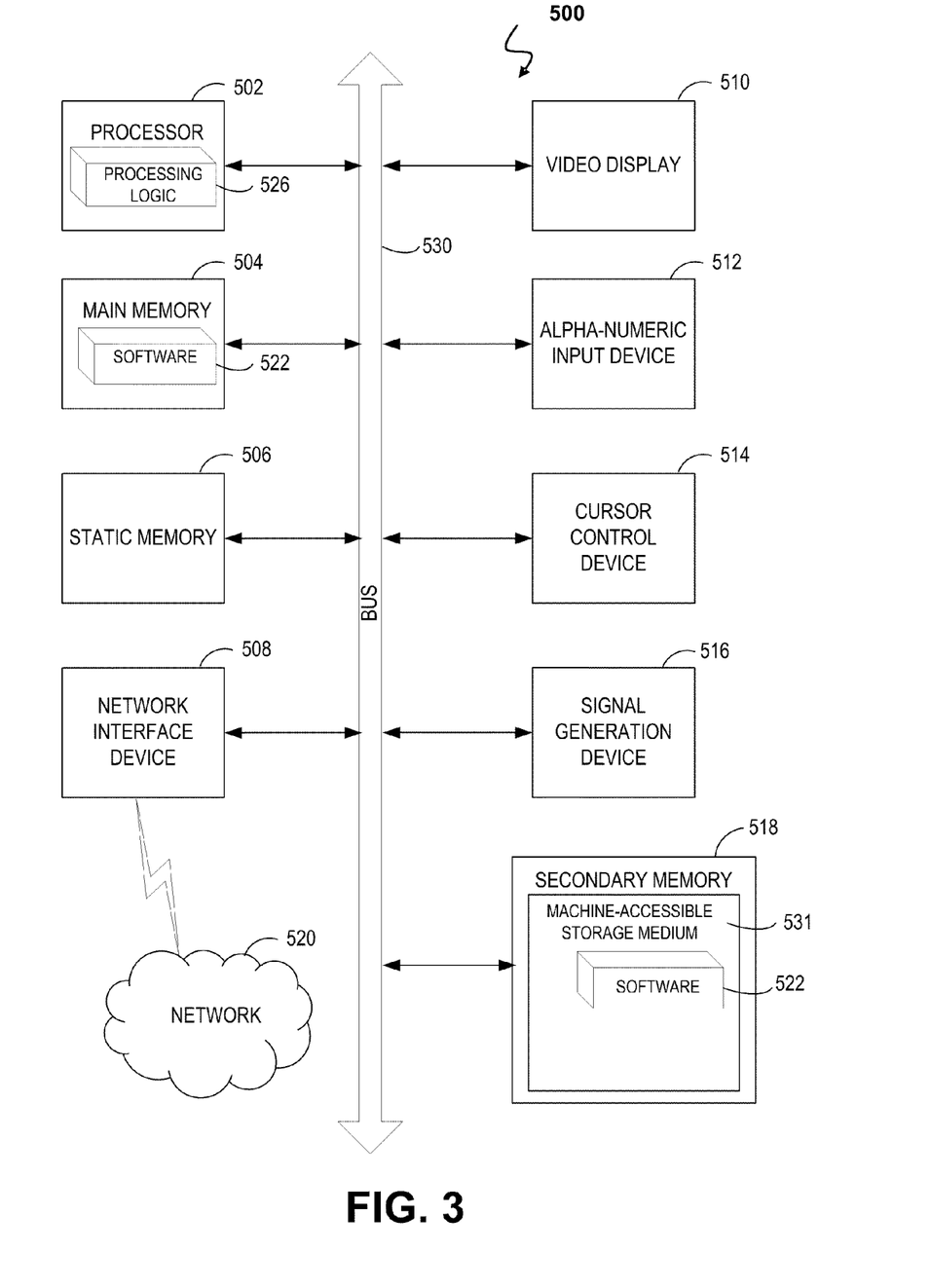
FIG. 3 depicts a block diagram of a computer system which may be employed to control the plasma etch system depicted in FIG. 1A to perform the methods of FIGS. 1B, 1C and 2A-2F.

FIG. 3 depicts a block diagram of a computer system which may be employed to control the plasma etch system depicted in FIG. 1A to perform the methods of FIGS. 1B, 1C and 2A-2F. The exemplary computer system 500 may be utilized to control one or more of the operations, process chambers or processing platforms described herein. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 500 includes a processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

The processor 502 represents one or more general-purpose processing devices such as a microprocessor, central processing unit, or the like. More particularly, the processor 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. The processor 502 may also be one or more special-purpose processing devices such as an application specific integrated circuit (ASIC), a field programmable gate array (FPGA), a digital signal processor (DSP), network processor, or the like. The processor 502 is configured to execute the processing logic 526 for performing the process operations discussed elsewhere herein.

The computer system 500 may further include a network interface device 508. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium (or more specifically a computer-readable storage medium) 531 on which is stored one or more sets of instructions (e.g., software 522) embodying any one or more of the methods or functions described herein. The software 522 may also reside, completely or at least partially, within the main memory 504 and/or within the processor 502 during execution thereof by the computer system 500, the main memory 504 and the processor 502 also constituting computer-readable storage media. The software 522 may further be transmitted or received over a network 520 via the network interface device 508.

The computer-readable storage medium 531 may further be used to store a set of instructions for execution by a processing system and that cause the system to perform any one or more of the embodiments of the present invention. Embodiments of the present invention may further be provided as a computer program product, or software, that may include a computer-readable storage medium having stored thereon instructions, which may be used to program a computer system (or other electronic devices) to perform a process according to the present invention. A computer-readable storage medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, and other such non-transitory storage media).

Thus, methods for etching multi-film stacks with polymer passivation of a previously etched layer vertically spaced apart from an unetched layer having a same or similar etch characteristic have been disclosed. Although embodiments of the present invention have been described in language specific to structural features or methodological acts, it is to be understood that the invention conveyed herein is not necessarily limited to the specific features or embodiments described.

What is claimed is:

1. A method of plasma etching a workpiece, comprising:
providing the workpiece to a plasma etch chamber, the workpiece including a film stack having a first film disposed over a third film with an intervening second film there between;
forming a patterned mask layer on top of the first film;
etching a first sidewall into the first film with a first plasma process;
etching a second sidewall into the second film with a second plasma process;
forming a polymer passivation on at least the first sidewall; and
etching a third sidewall into the third film with a third plasma process after forming the polymer passivation, wherein the second plasma process is different than the first and third plasma processes.

2. The method of claim 1, wherein the polymer passivation is formed with a fourth plasma processing condition, different than the first, second, and third plasma process.

3. The method of claim 2, wherein the fourth plasma process comprises providing a polymerizing source gas including at least one of $CH_4$, $C_4F_8$, $C_4F_6$, and $CHF_3$.

4. The method of claim 3, wherein the fourth plasma process comprises providing less bias power than the first, second and third plasma processes.

5. The method of claim 1, wherein the third sidewall etching and the polymer passivation formation is performed iteratively in an alternating manner until reaching a stop layer disposed below the third film.

6. The method of claim 1, wherein the first plasma process comprises providing a first gas chemistry, the second plasma process comprises providing a second gas chemistry, and wherein the polymer passivation is formed with a fourth plasma process comprising a polymerizing source gas having a greater amount of carbon than the first and second gas chemistries.

7. The method of claim 6, wherein the first and second gas chemistries are carbon-free.

8. The method of claim 7, wherein the first and third plasma process are the same and the etch selectivity between the first and third films is between 1:1 and 2:1.

9. The method of claim 7, wherein the first and third films comprise a material different than the second film the first and third gas chemistries comprise a first etchant gas and a second etchant gas, each including at least $Cl_2$.

10. The method of claim 9, wherein the first etchant gas further includes an additive gas comprising $N_2$ and $O_2$, the second etchant gas further includes HBr.

11. A method of plasma etching a workpiece, comprising:
providing the workpiece to a plasma etch chamber, the workpiece including a film stack having a first film disposed over a third film with an intervening second film there between and an etch stop layer disposed below the third film;
forming a patterned mask layer on top of the first film;
etching through the first film with a first gas chemistry;
etching through the second film with a second gas chemistry; and
alternating between a deposition of a polymer passivation with a fourth gas chemistry and an etching of the third film with a third gas chemistry to expose the etch stop layer, wherein the fourth gas chemistry comprises more carbon than the first, second, and the third gas chemistries, and wherein the second plasma process is different than the first and third processes.

12. The method of claim 11, wherein the first and third films each comprise tungsten, titanium, tantalum, aluminum, and wherein the second film comprises polysilicon or amorphous silicon.

13. The method of claim 12, wherein the first, second and third gas chemistries comprise $Cl_2$ and a fluorinated etchant gas, and at least one of $O_2$ and $N_2$, and wherein the fourth gas chemistry further comprises a polymerizing source gas including at least one of $CH_4$, $C_4F_8$, $C_4F_6$, and $CHF_3$.

14. The method of claim 13, wherein the fourth gas chemistry further includes Ar at a 1:8 to 1:1 ratio with the polymerizing source gas.

15. The method of claim 13, wherein the fluorinated etchant gas in the first and third gas chemistries is NF3 and wherein the fluorinated etchant gas in the second gas chemistry includes both $CF_4$ and $CHF_3$.

16. The method of claim 15, wherein the deposition of the polymer passivation further comprises applying a lower RF bias power than applied during the etching of the third film.

17. The method of claim 16, wherein the deposition of the polymer passivation further comprises applying 0 W RF bias power.

18. The method of claim 17, wherein the first gas chemistry comprises both of $O_2$ and $N_2$ while the third gas chemistry comprises $N_2$, but not $O_2$.

* * * * *

UNITED STATES PATENT AND TRADEMARK OFFICE
CERTIFICATE OF CORRECTION

PATENT NO. : 8,747,684 B2
APPLICATION NO. : 12/860672
DATED : June 10, 2014
INVENTOR(S) : Srinivasan et al.

It is certified that error appears in the above-identified patent and that said Letters Patent is hereby corrected as shown below:

In the Specification

Column 1, line 24, replace "devices have include highly integrated film stack" with "devices include highly integrated film stacks"

Column 1, line 26, replace "in wide" with "in a wide"

Column 1, line 27, replace "such microprocessors" with "such as microprocessors"

Column 2, line 19, delete "is"

Column 2, line 26, replace "Cl2 and SF6" with "$Cl_2$ and $SF_6$"

Column 2, line 27, replace "Cl2 and NF3" with "$Cl_2$ and $NF_3$"

Column 2, line 29, replace "Cl2" with "$Cl_2$"

Column 2, line 29, replace "more or more" with "one or more"

Column 2, line 29, replace "CHF3 and CF4" with "$CHF_3$ and $CF_4$"

Column 2, line 31, replace "N2 and/or O2" with "$N_2$ and/or $O_2$"

Column 3, line 56, replace "inch" with "inches"

Column 6, line 2, replace "in art" with "in the art"

Column 6, line 57, replace "layer" with "layers"

Column 7, line 24, replace "chemistry the" with "chemistry, the"

Column 9, lines 3-4, replace "relative operation" with "relative to operation"

Signed and Sealed this
Twenty-sixth Day of August, 2014

Michelle K. Lee
*Deputy Director of the United States Patent and Trademark Office*

CERTIFICATE OF CORRECTION (continued)

In the Claims

Column 11, line 20, Claim 2, replace "process" with "processes"

Column 11, line 23, Claim 3, replace "$C_4F_8,C_4F_6$" with "$C_4F_8, C_4F_6$"

Column 11, line 44, Claim 9, replace "second film the first" with "second film, the first"

Column 12, line 34, Claim 15, replace "NF3" with "$NF_3$"